(12) United States Patent
Richter et al.

(10) Patent No.: US 9,691,965 B2
(45) Date of Patent: Jun. 27, 2017

(54) METHOD FOR MAKING ELECTRICAL CONTACT WITH AN ELECTRONIC COMPONENT IN THE FORM OF A STACK, AND ELECTRONIC COMPONENT HAVING A CONTACT-MAKING STRUCTURE

(71) Applicants: Thomas Richter, Regensburg (DE); Andreas Lenk, Bannewitz ot Possendorf (DE); Claus Zumstrull, Regenstauf (DE)

(72) Inventors: Thomas Richter, Regensburg (DE); Andreas Lenk, Bannewitz ot Possendorf (DE); Claus Zumstrull, Regenstauf (DE)

(73) Assignee: CONTINENTAL AUTOMOTIVE GMBH, Hanover (DE)

( * ) Notice: Subject to any disclaimer, the term of this patent is extended or adjusted under 35 U.S.C. 154(b) by 310 days.

(21) Appl. No.: 14/360,982

(22) PCT Filed: May 8, 2013

(86) PCT No.: PCT/EP2013/059562
§ 371 (c)(1),
(2) Date: May 28, 2014

(87) PCT Pub. No.: WO2013/167643
PCT Pub. Date: Nov. 14, 2013

(65) Prior Publication Data
US 2015/0048722 A1   Feb. 19, 2015

(30) Foreign Application Priority Data

May 8, 2012   (DE) .................... 10 2012 207 598

(51) Int. Cl.
*H01L 41/083*   (2006.01)
*H01L 41/29*    (2013.01)
(Continued)

(52) U.S. Cl.
CPC ............ *H01L 41/083* (2013.01); *B32B 37/12* (2013.01); *B32B 38/0008* (2013.01);
(Continued)

(58) Field of Classification Search
CPC ............... H01L 41/083; H01L 41/0471; H01L 41/0472; H01L 41/277; H01L 41/293;
(Continued)

(56) References Cited

U.S. PATENT DOCUMENTS 5,254,212 A * 10/1993 Someji ................. H01L 41/293
                                                         216/20
5,406,164 A *  4/1995 Okawa ................. H01L 41/293
                                                         310/328

(Continued)

FOREIGN PATENT DOCUMENTS

DE       4224284 A1    1/1993   ........... H01L 41/047
DE      10153770 A1    6/2002   ........... H01L 41/047
(Continued)

*Primary Examiner* — Thomas Dougherty
(74) *Attorney, Agent, or Firm* — Slayden Grubert Beard PLLC

(57) ABSTRACT

A method is provided for making electrical contact with an electronic component in the form of a stack formed from a plurality of material layers, which react upon application of an electric field, and a plurality of electrode layers, wherein each material layer is arranged between two of the electrode layers. An insulation structure is generated on at least one stack circumferential region of the stack, which exposes each second electrode layer of the at least one stack circumferential region for electrical contact to be made. Also, a contact-making structure is applied to the at least one stack circumferential region which is provided with the insulation structure. Before the step of generating the contact-making (Continued)

structure, the material layers are partially removed by a material-removing method such that the electrode layers are exposed close to the surface.

10 Claims, 2 Drawing Sheets

(51) Int. Cl.
*H01L 41/047* (2006.01)
*H01L 41/293* (2013.01)
*H01L 41/335* (2013.01)
*B32B 37/12* (2006.01)
*B32B 38/00* (2006.01)
*H01L 41/277* (2013.01)
*H01L 41/297* (2013.01)

(52) U.S. Cl.
CPC ...... *B32B 38/0012* (2013.01); *H01L 41/0471* (2013.01); *H01L 41/0472* (2013.01); *H01L 41/277* (2013.01); *H01L 41/293* (2013.01); *H01L 41/297* (2013.01); *H01L 41/335* (2013.01); *B32B 2307/20* (2013.01); *B32B 2310/0843* (2013.01); *B32B 2310/0875* (2013.01); *B32B 2311/00* (2013.01); *B32B 2457/00* (2013.01)

(58) Field of Classification Search
CPC ..... H01L 41/297; H01L 41/335; B32B 37/12; B32B 38/0008; B32B 38/0012
USPC .......................................... 310/366; 29/25.35
See application file for complete search history.

(56) References Cited

U.S. PATENT DOCUMENTS

| | | | | |
|---|---|---|---|---|
| 6,104,129 | A  * | 8/2000 | Okamoto | H01L 41/293 310/366 |
| 6,462,464 | B2 | 10/2002 | Mitarai et al. | 310/366 |
| 7,905,000 | B2 * | 3/2011 | Ganster | H01L 41/273 29/25.35 |
| 8,106,566 | B2 | 1/2012 | Denneler et al. | 310/328 |
| 2002/0170341 | A1 * | 11/2002 | Jakoby | G01N 11/16 73/54.24 |
| 2003/0137057 | A1 * | 7/2003 | Honda | H01L 21/4857 257/778 |
| 2013/0127302 | A1 * | 5/2013 | Benkert | H01L 41/083 310/366 |
| 2015/0325781 | A1 * | 11/2015 | Rinner | H01G 4/232 310/311 |

FOREIGN PATENT DOCUMENTS

| | | | | |
|---|---|---|---|---|
| DE | 102006003070 | B3 | 3/2007 | ......... H01L 41/047 |
| DE | 102006049323 | A1 | 4/2008 | ......... H01L 41/047 |
| DE | 102008049788 | A1 | 6/2010 | ......... H01L 41/047 |
| DE | 102010022911 | A1 | 12/2011 | ......... H01L 41/083 |
| DE | WO-2011-154352 | A1 * | 12/2011 | ......... H01L 41/24 |
| DE | 102012207598 | A1 * | 1/2012 | ......... H01L 41/083 |
| GB | 2258084 | A | 1/1993 | ......... H01L 41/047 |
| JP | 62239588 | A | 10/1987 | ......... H01L 41/083 |
| JP | 5003352 | A | 1/1993 | ......... H01L 41/09 |
| JP | 7074410 | A | 3/1995 | ......... H01L 41/083 |
| JP | 2001102647 | A | 4/2001 | ......... H01L 41/083 |
| JP | 2004186507 | A | 7/2004 | ......... H01L 41/083 |
| JP | 2005079313 | A | 3/2005 | ......... H01L 41/083 |
| JP | 2005150167 | A | 6/2005 | ......... H01L 41/083 |
| JP | 2011507221 | A | 3/2011 | ......... F02M 51/06 |
| WO | 2013/167643 | A2 | 11/2013 | ......... H01L 41/29 |

* cited by examiner

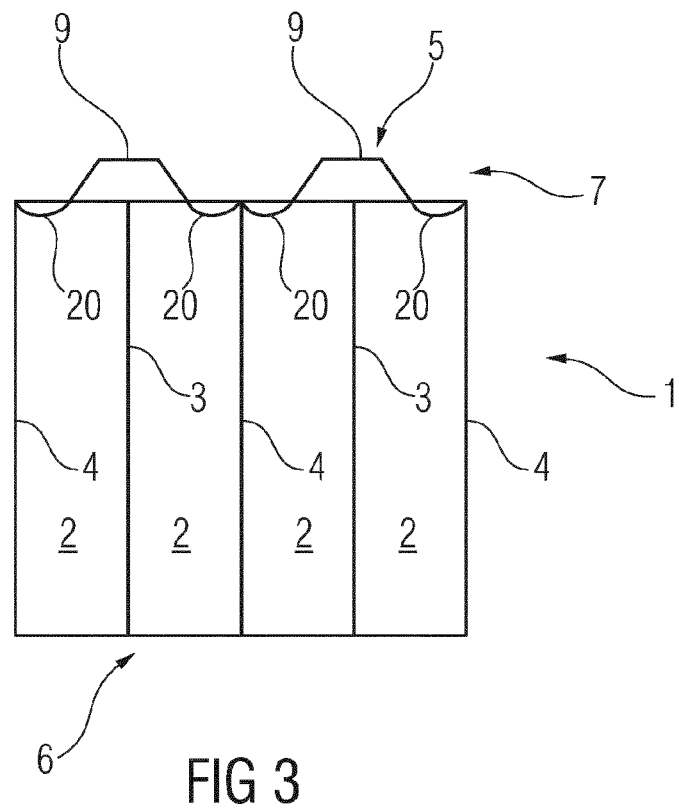
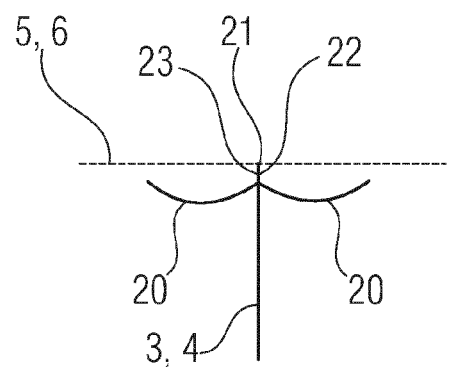

METHOD FOR MAKING ELECTRICAL CONTACT WITH AN ELECTRONIC COMPONENT IN THE FORM OF A STACK, AND ELECTRONIC COMPONENT HAVING A CONTACT-MAKING STRUCTURE

CROSS-REFERENCE TO RELATED APPLICATIONS

This application is a U.S. National Stage Application of International Application No. PCT/EP2013/059562 filed May 8, 2013, which designates the United States of America, and claims priority to DE Application No. 10 2012 207 598.4 filed May 8, 2012, the contents of which are hereby incorporated by reference in their entirety.

TECHNICAL FIELD

The invention relates to a method for making electrical contact with an electronic component in the form of a stack which is formed from a plurality of material layers that react upon application of an electric field, and a number of electrode layers, wherein each material layer is arranged between two of the electrode layers. The invention also relates to an electronic component in the form of a stack, of the abovementioned type.

BACKGROUND

Such a component made of layers of material layer and electrode layer that are stacked one on top of another and in a manner alternating with one another is generally known as a stack. The currently best-known electronic component of this type is a stack that is generally known as a piezo actuator, which is used as an actuating element in injection valves of a large variety of engine types for motor vehicles. The material layers are ceramic layers in this piezo actuator.

Usually, such a stack has a rectangular or square cross section when observed in plan view. Electrical contact is made with the stack on two opposite circumferential sides. In order to be able to carry this out in a technologically careful manner, in the past the electrode layers were geometrically laid out such that only every second electrode layer extends laterally as far as one of the two circumferential sides, while the other electrode layers in each case do not extend as far as this circumferential side. The same goes in an analogous manner for the other circumferential side of the stack.

Furthermore, what are known as fully active stacks are known, in which the electrode layers and the material layers have the same area, with the result that all of the electrode layers each extend as far as the opposite circumferential sides. Since all of the electrode layers of the component extend as far as the two opposite circumferential sides, contact has to be made in a different way.

DE 101 53 770 A1 discloses a method for making contact with a stacked piezoelectric device. In this method, every second electrode layer is provided with an electrically insulating layer in an alternating manner on both sides. Subsequently, the exposed electrode layers of each circumferential side are connected together via a conductive layer. The conductive layer used is a resin which contains conductive particles.

DE 10 2006 003 070 B3 discloses a method for making electrical contact with a component in the form of a stack, said component consisting of material layers and electrode layers. For making contact, an insulation layer is applied to two opposite sides. Subsequently, each insulation film is opened by laser patterning at the position of every second electrode layer. Subsequently, the electrode layers are connected together on every circumferential side by way of an electrically conductive material.

Generally, on account of given requirements, high temperature resistance of the actuator and high durability are demanded. Essential for this purpose is good connection of external electrodes to the very thin electrode layers of the stack. If the electrical connection of the external electrodes to the electrode layers does not have low impedance or is flawed, excessive current densities and thus increased temperatures can occur locally, and this can result in permanent loss of contact in the worst case. This problem occurs in particular when the material of the external electrodes which make electrical contact with the electrode layers on the opposite circumferential layers is formed from a conductive adhesive. A conductive adhesive comprises electrically conductive particles, for example made of silver, gold or any other desired metal or a metal alloy, which are embedded in an insulating backing material, for example a polyimide resin, an epoxy resin, etc.

SUMMARY

One embodiment provides a method for making electrical contact with an electronic component in the form of a stack which is formed from a plurality of material layers that react upon application of an electric field, and a plurality of electrode layers, wherein each material layer is arranged between two of the electrode layers, in which: an insulation structure is produced on at least one stack circumferential region of the stack, with the result that every second electrode layer of the at least one stack circumferential region is exposed for electrical contact to be made; and a contact-making structure is applied to the at least one stack circumferential region that is provided with the insulation structure; wherein before the step of producing the contact-making structure, the material layers are partially removed by means of a material-removing method in such a way that at least every second electrode layer is exposed close to the surface.

In a further embodiment, the partial removal, close to the surface, of the material of the material layers takes place before the step of producing the insulation structure.

In a further embodiment, the partial removal, close to the surface, of the material of the material layers takes place after the step of producing the insulation structure.

In a further embodiment, at the same time as the exposure of every second electrode layer of the at least one stack circumferential region for making electrical contact, the removal of the material of the material layers in the exposed regions takes place.

In a further embodiment, the exposure of every second electrode layer and the removal of the material of the material layers take place by way of the same machining method.

In a further embodiment, the partial removal, close to the surface, of the material of the material layers takes place by means of grinding, brushing, blasting or by way of a laser.

In a further embodiment, after the step of producing the insulation structure and the optionally following step of partially removing the material of the material layers, a thin metal layer is applied to the stack circumferential region, in particular by sputtering, the contact-making structure being applied to said thin metal layer in a subsequent step.

Another embodiment provides an electronic component in the form of a stack, comprising: a plurality of electrode layers; a plurality of material layers that react upon application of an electric field, wherein each material layer is arranged between two of the electrode layers; an insulation structure which has been applied to at least one stack circumferential region of the stack, wherein the insulation layer has been formed such that every second electrode layer of a stack circumferential region is exposed for electrical contact to be made; and a contact-making structure applied to the at least one stack circumferential region provided with the insulation structure; wherein the material layers have been at least partially removed and replaced by material of the insulation structure or of the contact-making structure in a section which extends parallel to a longitudinal axis of the stack and perpendicularly through one of the stack circumferential regions, at least in a region, close to the surface, which adjoins the exposed electrode layers.

In a further embodiment, the material layers have a concave form in a sectional view through the section between two adjacent electrode layers.

In a further embodiment, the material layers have been reduced regionally by at most 10 μm to 20 μm with respect to the stack circumferential region.

In a further embodiment, the material of the contact-making structure comprises a conductive adhesive having a backing made of a nonconductive material, in particular polyimide, and metal particles embedded therein.

BRIEF DESCRIPTION OF THE DRAWINGS

Example embodiments of the invention are described in more detail below with reference to the exemplary embodiments in the drawing, in which:

FIG. 3 shows a schematic cross-sectional illustration of a part of a second embodiment of a component stack, in which the material layers have been partially removed in an alternative configuration, and FIG. 4 shows an enlarged illustration of the material removal in the region of an electrode layer of a component stack.

DETAILED DESCRIPTION

Figure 1:
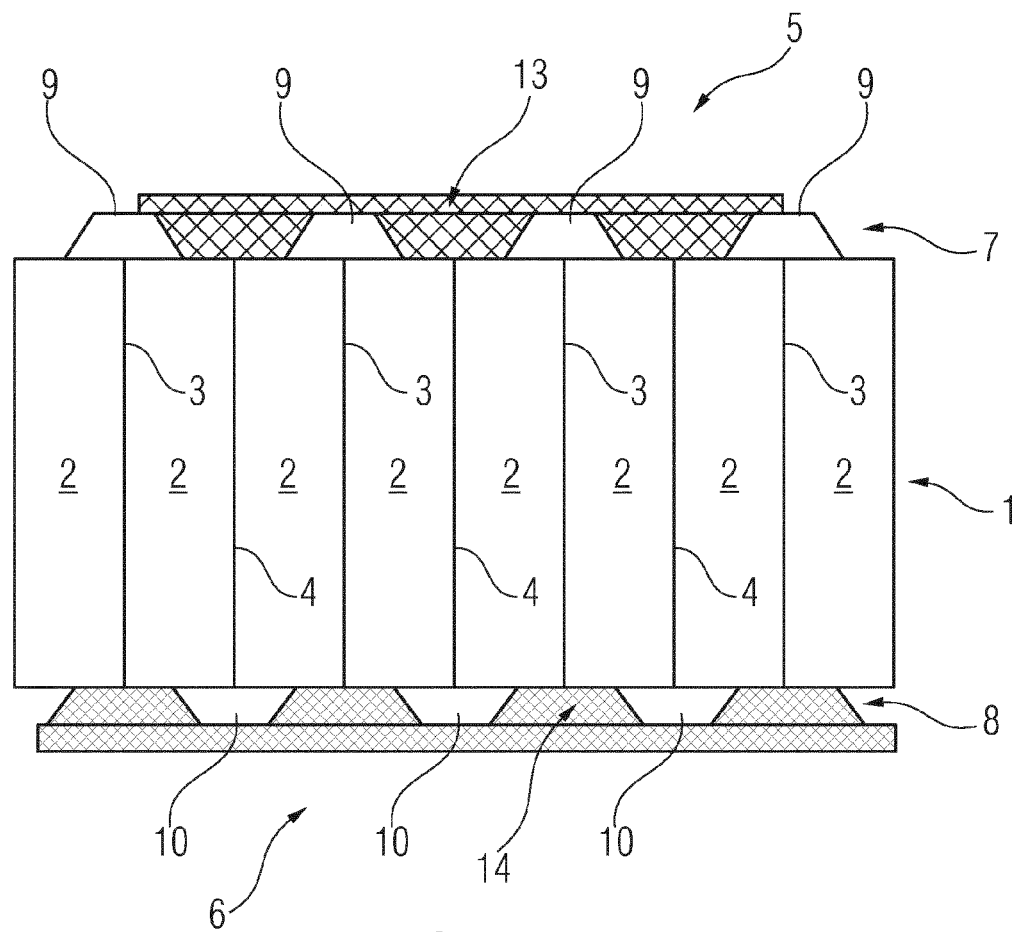
FIG. 1 shows a schematic cross-sectional illustration of a known component, an insulation structure and a contact-making structure having been applied to the stack of said component, including material layers and electrode layers.

Embodiments of the invention provide a method for making electrical contact with an electronic component in the form of a stack, and also an electronic component, said method and component allowing improved long-term reliability of the stack.

Some embodiments provide a method for making electrical contact with an electronic component in the form of a stack which is formed from a plurality of material layers that react upon application of an electric field, and a plurality of electrode layers, wherein each material layer is arranged between two of the electrode layers. An insulation structure is produced on at least one stack circumferential region of the stack, such that every second electrode layer of the at least one stack circumferential region is exposed for electrical contact to be made.

Preferably, in this case, every second electrode layer that is arranged preferably in an alternating manner with the exposed electrode layers is covered at least partially by the insulation structure.

The production of the insulation structure and the exposure of every second electrode layer from the insulation structure may for example take place in that first of all an insulation layer is applied to the stack circumferential region, material subsequently being removed from said insulation layer again in order to expose every second electrode layer. Alternatively, the insulation structure can also be applied via a direct patterning method, for example by means of spraying or dispensing, such that every second electrode layer remains exposed.

A contact-making structure is then applied to the at least one stack circumferential region that is provided with the insulation structure. Before the step of producing the contact-making structure, the material layers are partially removed by means of a material-removing method in such a way that the electrode layers are exposed close to the surface.

Preferably, as a result of the partial removal of the material layers, at least every second electrode layer is exposed close to the surface, in particular every electrode layer exposed from the insulation structure.

The advantage of the disclosed method is that, as a result of the exposure, close to the surface, of the electrode layers, an increased area for making electrical contact with the electrode layers is available. In this way, improved electrical connection of the electrode layers to the contact-making structure is possible. The risk of local excessive current densities and thus increased temperatures can be reduced in this way. As a result, the long-term reliability of the produced stack is improved.

In one embodiment, the removal of the material of the material layers takes place such that sections, close to the surface, of the electrode layers are at least partially exposed at their main surfaces in addition to their end sides adjoining the stack circumferential region. Electrical contact can thus be made not only at the end faces of the electrode layers, which are only a few micrometers wide in each case. Instead, a contact-making region can additionally be created at the respective main surfaces. The size of the contact-making region depends in this case substantially on the material-removing method selected and the duration of material removal.

Only as much material of the material layers should be removed as to create an increased contact area at the electrode layers. However, at the same time the stability of the thin electrode layers must not be weakened by the removal of the material layers. It is sufficient if—starting from a surface formed by the stack circumferential regions—the material of the material layers is removed to a depth of a few micrometers. In particular, the removal of the material of the material layers should not exceed a depth of 10 μm to 20 μm. At greater depths, there is the risk that the electrode layers and the material of the material layers which adjoins the electrodes could be damaged during further processing.

In a further expedient refinement, the partial removal, close to the surface, of the material of the material layers takes place before the step of producing the insulation structure. To this end, for example a respective stack circumferential region (to which the external electrodes are applied) may be ground flat before the production of the insulation structure, such that the electrode layers at the surfaces of the respective stack circumferential regions initially terminate flush with the material layers. Subsequently, the partial removal, close to the surface, of the material of the material layers takes place in order to expose the electrode layers in an approximately uniform manner close to the surface.

Alternatively, provision can also be made for the partial removal, close to the surface, of the material of the material layers to take place after the step of producing the insulation structure. In particular, the exposure of every second electrode layer and the removal of the material of the material layers can take place by way of the same machining method. An advantage of this procedure is that no additional tools or machining steps have to be provided in the context of the production of the component stack. The simultaneous exposure of every second electrode layer of the at least one stack circumferential region for making electrical contact and the removal of the material of the material layers in the exposed regions can occur for example using a laser.

The partial removal, close to the surface, of the material of the material layers can take place for example by means of grinding, brushing, blasting or the laser. Blasting can take place for example by means of particles (e.g. sand) introduced into a carrier stream. As a result of the machining methods mentioned, it is possible to ensure that only the material of the material layers, but not the material of the electrode layers, is removed during the machining operation. Likewise, these methods are suitable for removing the material of the insulation layer applied to the stack circumferential regions, in order to expose every second electrode layer.

In a further refinement, after the step of producing the insulation structure and the optionally following step of partially removing the material of the material layer, a thin metal layer is applied to the stack circumferential region, in particular by sputtering, the contact-making structure being applied to said thin metal layer in a subsequent step. The thin metal layer allows more reliable and flaw-free contact to be made with the electrode layers of the stack. If the contact-making structure, as is preferred, is realized by means of a conductive adhesive, then the metal particles contained in the conductive adhesive can also make electrical contact with the thin metal layer in the region of the insulation structure and thus make an additional contribution to current conduction. The reliability of the electronic component can also be increased hereby.

Other embodiments provide an electronic component in the form of a stack. Said component comprises a plurality of electrode layers and a plurality of material layers that react upon application of an electric field, wherein each material layer is arranged between two electrode layers. Also provided is an insulation structure which has been applied to at least one stack circumferential region of the stack, wherein the insulation layer has been formed such that every second electrode layer of a stack circumferential region is exposed for electrical contact to be made. A contact-making structure has been applied to at least one stack circumferential region provided with the insulation structure. The electronic component in the form of a stack is distinguished in that the material layers have been at least partially removed and replaced by material of the insulation structure or of the contact-making structure in a section which extends parallel to a longitudinal axis of the stack and perpendicularly through one of the stack circumferential regions, in a region, close to the surface, which adjoins the electrode layers.

In particular, the material layers may preferably have been at least partially removed and replaced by material of the contact-making structure in a region, close to the surface, which adjoins the exposed electrode layers. Thus, every second electrode layer is advantageously connected to the contact-making structure.

The region, close to the surface, of the stack should be understood here as meaning a plane or surface of the stack circumferential region when the insulation structure and the contact-making structure have not yet been applied to the stack circumferential region. After application, the insulation structure and the contact-making structure adjoin the region, close to the surface, of the material layers.

The stack formed according to the invention may have the same advantages as were explained above in connection with the method according to the invention.

Although the surface shape of the material layers machined by material removal may be configured in principle as desired, it is expedient for the material layers to have a concave form in a sectional view through the section between two adjacent electrode layers. The concave form, but also any other desired surface form of the material layers of the stack, results from the material-removing method that is selected for machining. In particular, the material layers have been reduced regionally by at most 10 µm to 20 µm with respect to the stack circumferential region. This small material removal on the one hand allows better contact to be made with the exposed sections of the electrode layers. On the other hand, the reduction in material is so small that the further processing of the stack prepared in this way does not require any modification of the method steps for applying the insulation structure and the contact-making structure. In particular, on account of the small material removal, it is also possible to ensure that the surfaces of a finished stack are planar.

Expediently, the material of the contact-making structure comprises a conductive adhesive having a backing made of a nonconductive material, in particular polyimide, and metal particles embedded therein. An advantage of the use of a conductive adhesive as the material for the contact-making structure is that the nonconductive backing material of the conductive adhesive has similar properties to the material used to produce the insulation structure. As a result, high long-term reliability of the stack can be favored, since high temperatures do not result in different expansions of the insulation structure and the contact-making structure. Furthermore, on account of the enlarged contact-making surface of the electrode layers, the risk of flawed contact points is reduced.

The starting point is an electronic component in the form of a stack 1. The stack 1 is formed from a plurality of material layers 2 that react upon application of an electric field, and a plurality of electrode layers 3, 4. Each of the material layers 2 is arranged between two of the electrode layers 3, 4. The electrode layers 3, 4 are guided on both sides as far as the respective peripheries of the stack 1. Electrical contact is made for example by interaction on opposite stack circumferential regions 5, 6 that are not geometrically contiguous. The surfaces of the stack circumferential regions 5, 6 are generally ground in order to obtain planar surfaces for further manufacturing steps. Such a stack 1 is known in principle from the prior art and serves for example as a piezo actuator for a piezo injector for a combustion engine.

As can be gathered from the schematic cross-sectional illustration in FIG. 1, an insulation structure 7 has been applied to the stack circumferential region 5. The insulation structure 7 is constructed such that the electrode layers 4 at the stack circumferential region 5 are exposed. For this purpose, insulation walls 9 have been applied to the electrode layers 3. Merely by way of example, the flanks thereof extend obliquely in the direction of the component stack 1. The flanks may also be formed perpendicularly to the plane of the stack circumferential region or in a domed manner, etc.

In a corresponding manner, an insulation structure 8 having insulation walls 10 on the electrode layers 4 is provided on the stack circumferential region 6. Flanks of the insulation walls 10 likewise extend merely by way of example in the direction of the component stack 1, wherein the electrode layers 3 are exposed. It goes without saying for a person skilled in the art that the flanks of the insulation walls 10 may also deviate from the form shown.

The production of the insulation structures 7, 8 takes place for example by way of a subtractive method. In this case, first of all a layer suitable for electrical insulation, for example made of a polymer or a ceramic or a temperature-stable glass, is applied to the respective stack circumferential region 5, 6 in a planar manner. By way of a patterning method, for example laser ablation or photo-patterning, every second of the electrode layers 3, 4 on a respective stack circumferential region is opened. Optionally, the insulation structure can also be applied via a direct patterning method, for example by means of spraying or dispensing. As long as the material of the insulation structure is formed from a temperature-stable glass, it is expedient for the latter to have reduced silver migration. As a result, the insulation property of the glass is not negatively influenced for a long period of time.

Electrical contact with the electrode layers 4 in the stack circumferential region 5 or with the electrode layers 3 in the stack circumferential region 6 is realized by way of a contact-making structure which can be realized for example by means of a conductive adhesive. In a conductive adhesive, conductive metal particles are introduced into a non-conductive material, for example a resin made of polyimide or epoxy. Suitable materials are in particular gold, silver, palladium, platinum, copper or nickel and alloys thereof. The thickness of the contact-making structure depends on the current-carrying capacity to be achieved of the contact-making structure. Similarly, the contact-making structures may also be formed from a metal or a metal alloy.

A respective contact-making structure 13, 14 thus undertakes the electrical connection to the exposed electrode layers 3 and 4 and serves to carry current at a predefined current-carrying capacity. The contact-making structure 13, 14 thus forms respective external electrodes.

Since the electrode layers 4 are only a few micrometers thick, typically 1 to 4 μm, there is the risk, in particular when a conductive adhesive is used as the material of the contact-making structure, that individual electrode layers or sections of electrode layers will not be connected sufficiently electrically to the contact-making structure. As a result, a high contact resistance is produced, and so excessive current densities and increased temperatures can occur locally.

In order to improve the connection of the material of the contact-making structure to the electrode layers, the material layers may be partially removed before the production of the contact-making structure by means of a material-removing method, such that the electrode layers are exposed close to the surface. This is illustrated for example in FIG. 2, wherein the partial removal of the material of the material layers takes place here before the application of the insulation structure.

Figure 2:
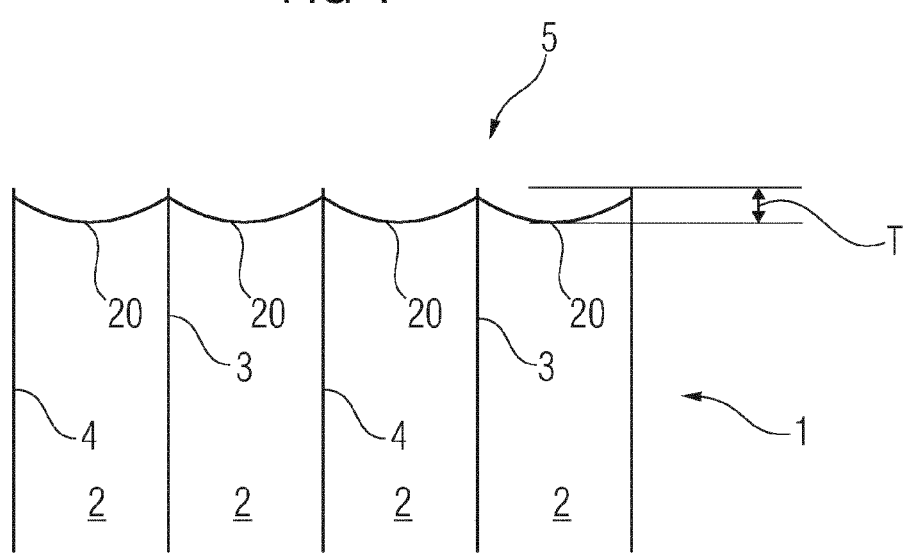
FIG. 2 shows a schematic cross-sectional illustration of a part of a first embodiment of a component stack, in which the material layers have been partially removed.

The removal of the material of the material layers may take place for example by means of grinding, brushing, blasting or by way of a laser. If the stack circumferential regions 5, 6 (wherein only the stack circumferential region 5 is illustrated in FIG. 2) are machined by means of sand blasting, this results for example in a concave form of the surfaces of the material layers 2 between two adjacent electrode layers. The section illustrated in FIG. 2 extends in this case parallel to a longitudinal axis of the stack (which extends from left to right in the plane of the sheet in FIG. 2) and perpendicularly through the stack circumferential region 5 (i.e. from top to bottom in the plane of the sheet). By way of the material-removing method, sections, close to the surface, of the electrode layers 3, 4 are exposed at least partially at their opposite main surfaces 22, 23 in addition to their end sides 21 adjoining the stack circumferential region 5, 6. This is illustrated in an enlarged manner and for only two mutually adjoining material layers 2 in FIG. 4.

The depth T of removal of the material of the material layers 2 is at most 10 μm to 20 μm starting from the outermost end of an electrode layer 3, 4 to the lowest point of the machined material layer 2. Depending on the machining method selected, a lesser material removal results here under certain circumstances in the region of the electrode layers than for example in the middle between two electrode layers. As a result, only a few micrometers are freed of the material of the material layer 2 in the region, close to the surface, of the electrode layers. These exposed contact areas of the electrode layers are sufficient, however, to provide improved electrical connection to the material of the contact-making structure.

FIG. 3 illustrates a detail of a component stack 1, in which the production of the material removal 20 takes place only after the production of the insulation structure 7. The exposure of the regions required for the contact-making structure in the insulation 9 and the production of the material removals 20 can in this case take place using the same machining method. For example, the production of the trenches in the insulation structure 7 can be carried out using a laser. This can also be used to remove the material of the material layer 2 in the region between two walls 9, such that again the concave material removals are produced.

In an alternative configuration, the production of the trenches in the insulation structure 7 and the production of the material removals 10 in the material layers 2 can also take place using different machining methods.

In order to further improve the electrical connection of the contact-making structure 13, 14 to the electrode layers 3, 4, provision can furthermore be made to apply a thin metal layer, in particular by sputtering, to the surface structures produced in FIGS. 2 and 3. The above-described contact-making structure is then applied to this thin metal layer in a following step.

On account of the small depth of the material removal 20 in the material layers, following the production of the insulation structure and the contact-making structure, it is nevertheless ensured that the finished component stack has a planar surface.

It is clear for a person skilled in the art that the cross sections, illustrated in FIGS. 2 and 3, of the material removals 20 are merely by way of example and depend on the method used for material removal. In particular, it is also possible for an identical material thickness of the material layer to be removed over the entire width between two electrode layers. Similarly, it is possible for the removal of a material layer not to take place over the entire width between two electrodes, but merely in the immediate region of the electrode layers. In this case, the material removal may also have a convex form in cross section.

Similarly, it is not necessary for the material removal to have the same shape along the entire length of an electrode layer. Depending on the processing method used, the removal may also vary along the length of a respective electrode layer.

The proposed procedure is advantageous in particular in conjunction with the use of conductive adhesive as the material of the contact-making structure, since, following the application of the material of the contact-making structure, the metal particles contained in the conductive adhesive are distributed randomly. However, the larger the contact area that is available for the metal particles, the lower the risk that local points with a high contact resistance will arise.

What is claimed is:

1. A method for making electrical contact with an electronic component, the method comprising:
    forming a stack including (a) a plurality of material layers that react upon application of an electric field and (b) a plurality of electrode layers having a top, a bottom, and an edge surface, wherein each material layer is arranged between two of the electrode layers;
    removing portions of the material layers near an outer surface of the stack using a material-removing method, to expose both the edge surface and a portion of the top and the bottom surfaces of the electrode layers around a perimeter of the stack with a depth defined radially along the exposed portion of the top and the bottom surfaces;
    wherein the remaining portions of the material layers have a concave form extending from a first point of contact with a respective first adjacent electrode layer to a second point of contact with a respective second adjacent electrode layer;
    forming an insulation structure at the perimeter of the stack, the insulation structure insulating every second electrode layer; and
    applying a contact-making structure at the stack circumferential region the contact-making structure making contact with the electrode layers that are not insulated by the insulation structure.

2. The method of claim 1, wherein the removal of the portions of the material layers is performed before the step of forming the insulation structure.

3. The method of claim 1, wherein the removal of the portions of the material layers is performed is performed after the step of forming the insulation structure.

4. The method of claim 3, wherein the removal of the portions of the material layers is performed is performed simultaneous with the exposure of every second electrode layer of the stack circumferential region for making electrical contact.

5. The method of claim 3, wherein the exposure of every second electrode layer and the removal of the material of the material layers are performed by the same machining method.

6. The method of claim 1, wherein the removal of the portions of the material layers is performed is performed by at least one of a grinding process, a brushing process, a blasting process, and a laser-based material removal process.

7. The method of claim 1, comprising:
    after the step of forming the insulation structure, applying a thin metal layer to the stack circumferential region by sputtering, and
    subsequently applying the contact-making structure to said thin metal layer.

8. An electronic component, comprising:
    a stack comprising:
    a plurality of electrode layers, each electrode layer having a top, a bottom, and an edge surface; and
    a plurality of material layers that react upon application of an electric field, wherein each material layer is arranged between two of the electrode layers;
    an insulation structure applied to at least one stack circumferential region of the stack, wherein the insulation layer is formed such that every second electrode layer is exposed for electrical contact near a respective stack circumferential region; and
    a contact-making structure applied to the at least one stack circumferential region, the contact-making structure making contact with the exposed electrode;
    wherein a portion of each of the material layers of the stack is removed to expose both the edge surface and a portion of the top and the bottom surfaces of the electrode layers around a perimeter of the stack with a depth defined radially along the exposed portion of the top and the bottom surfaces, and replaced by material of the insulation structure or the contact-making structure;
    wherein the material layers have a concave form extending from a first point of contact with a respective first adjacent electrode layer to a second point of contact with a respective second adjacent electrode layer.

9. The stack of claim 8, wherein the exposed depth of each electrode layer has a thickness of no more than 20 µm.

10. The stack of claim 8, wherein the contact-making structure is formed from a conductive adhesive having a backing made of polyimide, and metal particles embedded therein.

* * * * *